(12) United States Patent
Maynard

(10) Patent No.: US 12,374,815 B2
(45) Date of Patent: Jul. 29, 2025

(54) ELECTRICAL CONNECTOR WITH INTEGRATED GROUND PLANE

(71) Applicant: Neoconix, Inc., San Jose, CA (US)

(72) Inventor: Woody Maynard, State College, PA (US)

(73) Assignee: Neoconix, Inc., San Jose, CA (US)

( * ) Notice: Subject to any disclaimer, the term of this patent is extended or adjusted under 35 U.S.C. 154(b) by 447 days.

(21) Appl. No.: 17/820,510

(22) Filed: Aug. 17, 2022

(65) Prior Publication Data
US 2024/0063562 A1    Feb. 22, 2024

(51) Int. Cl.
*H01R 12/73*    (2011.01)
*H01R 13/24*    (2006.01)
(Continued)

(52) U.S. Cl.
CPC ....... *H01R 12/732* (2013.01); *H01R 13/2435* (2013.01); *H01R 13/648* (2013.01); *H05K 1/0218* (2013.01); *H05K 3/3436* (2013.01); *H05K 7/1069* (2013.01); *H01R 4/04* (2013.01); *H01R 12/71* (2013.01); *H01R 12/714* (2013.01);
(Continued)

(58) Field of Classification Search
CPC .............. H01R 12/732; H01R 13/2435; H01R 13/648; H01R 4/04; H01R 12/71; H01R 12/714; H01R 12/716; H01R 12/73; H01R 13/03; H01R 13/2442; H01R 13/6585; H01R 13/6591; H01R 13/6594; H05K 1/0218; H05K 3/3436; H05K 7/1069; H05K 1/0216; H05K 7/10; H05K 7/1053; H05K 7/1061
See application file for complete search history.

(56) References Cited

U.S. PATENT DOCUMENTS 6,719,569 B2    4/2004    Ochiai
7,121,839 B2 *  10/2006   Rathburn .......... H01L 23/49811
                                                   439/91
(Continued)

FOREIGN PATENT DOCUMENTS

CN    114731003 A    7/2022
TW    202226674 A    7/2022

OTHER PUBLICATIONS

Office Action cited in corresponding Taiwan Patent Application No. 112129397, issued Oct. 25, 2023, 7 pages.

*Primary Examiner* — Justin M Kratt

(57) ABSTRACT

An electrical connector includes a contact array of signal pins and an integrated ground plane. In one embodiment, the electrical connector includes an array of contact elements and the integrated ground plane includes openings for contact elements forming signal pins and includes closed portions positioned over contact elements to be connected to the ground potential. The array of contact elements is formed with a subset of the contact elements being trapped or compressed under the integrated ground plane. The trapped contact elements are electrically connected to the ground potential without each being connected to a ground connection external to the connector. The integrated ground plane can be provided integrally within the electrical connector or as a separate element attached to the connector. In another embodiment, an electrical connector includes an array of contact elements formed in a contact element layer incorporating an integrated ground plane.

23 Claims, 7 Drawing Sheets

(51) Int. Cl.
*H01R 13/648* (2006.01)
*H05K 1/02* (2006.01)
*H05K 3/34* (2006.01)
*H05K 7/10* (2006.01)
*H01R 4/04* (2006.01)
*H01R 12/71* (2011.01)
*H01R 13/03* (2006.01)
*H01R 13/6585* (2011.01)
*H01R 13/6591* (2011.01)
*H01R 13/6594* (2011.01)

(52) U.S. Cl.
CPC ............ *H01R 12/716* (2013.01); *H01R 12/73* (2013.01); *H01R 13/03* (2013.01); *H01R 13/2442* (2013.01); *H01R 13/6585* (2013.01); *H01R 13/6591* (2013.01); *H01R 13/6594* (2013.01); *H05K 1/0216* (2013.01); *H05K 7/10* (2013.01); *H05K 7/1053* (2013.01); *H05K 7/1061* (2013.01)

(56) References Cited

U.S. PATENT DOCUMENTS

2007/0020960 A1 1/2007 Williams
2011/0059631 A1 3/2011 Tamura

\* cited by examiner

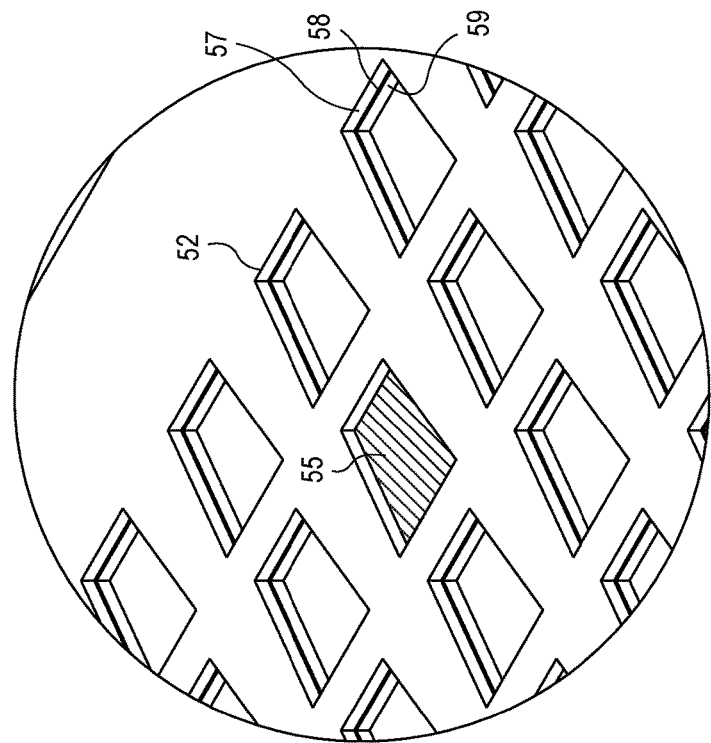
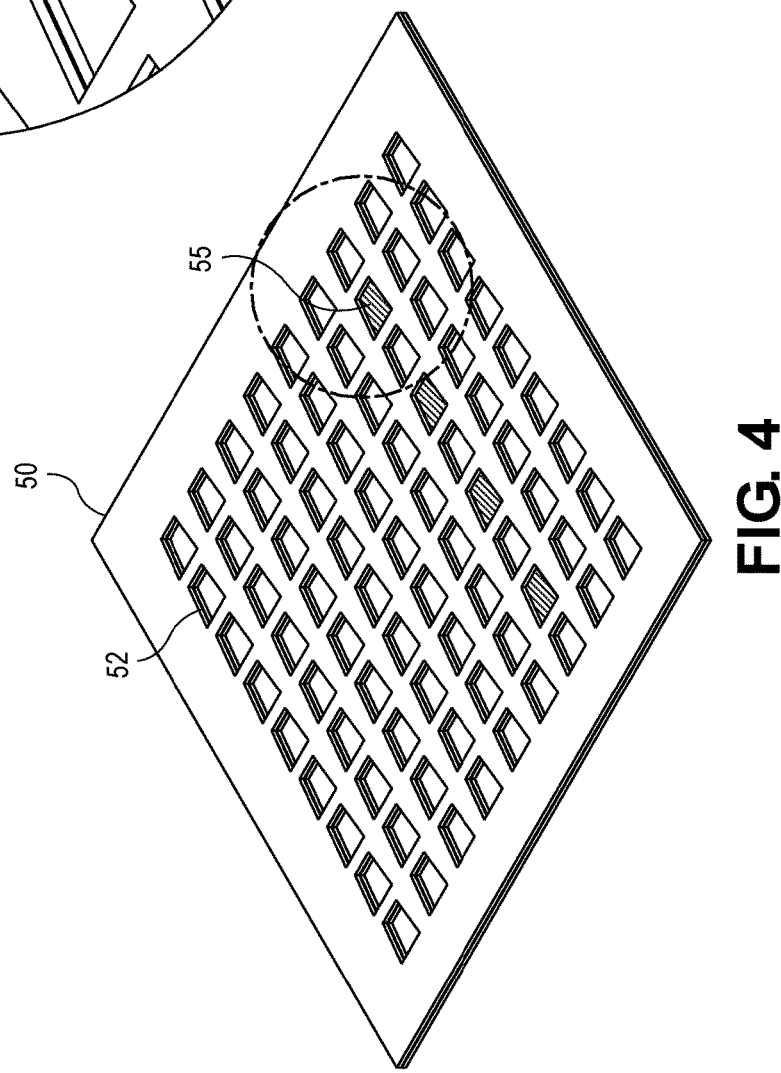
FIG. 4(a)
FIG. 4

ELECTRICAL CONNECTOR WITH INTEGRATED GROUND PLANE

FIELD OF THE INVENTION

The invention relates to reconnectable, remountable electrical connectors, and, in particular, to an electrical connector incorporating an integrated ground plane.

BACKGROUND OF THE INVENTION

Electrical interconnects or connectors are used to connect two or more electronic components together or to connect an electronic component to a piece of electrical equipment, such as a computer, router, or tester. For instance, an electrical interconnect is used to connect an electronic component, such as an integrated circuit (an IC or a chip), to a printed circuit broad. An electrical interconnect is also used during integrated circuit manufacturing for connecting an IC device under test to a test system. In some applications, the electrical interconnect or connector provides separable or remountable connection so that the electronic component attached thereto can be removed and reattached. For example, it may be desirable to mount a packaged microprocessor chip to a personal computer mother board using a separable interconnect device so that malfunctioning chips can be readily removed or upgraded chips can be readily installed.

The ability to make separable electrical contact with contacts of semiconductor scale electronic circuits has become more problematic as the mechanical, electrical, and reliability requirements of these electrical contacts become more demanding. Nano springs, pogo pins, micro springs, and other miniature contact devices have been developed to deal with the problem of making reliable electrical contact between semiconductor integrated circuits or between a semiconductor integrated circuit and an electronic system, such as one built on a printed circuit board (PCB). In some examples, conventional electrical connectors are made of stamped metal springs, which are formed and then individually inserted into an insulating carrier to form an array of electrical connector elements. Other approaches to making electrical connectors include using isotropically conductive adhesives, injection molded conductive adhesives, bundled wire conductive elements, springs formed by wire bonding techniques, and small solid pieces of metal.

Land grid array (LGA) refers to an array of metal pads (also called lands) that are used as the electrical contact points for an integrated circuit package, a printed circuit board, or other electronic component. The metal pads are usually formed by lithographically defining and etching them on an insulating surface or substrate. It is common to then coat the surface with a gold film or other noble metal to provide a non-oxidizing surface. Ball Grid array (BGA) refers to an array of solder balls or solder bumps that are used as the electrical contact points for an integrated circuit package. Both LGA and BGA packages are widely used in the semiconductor industry and each has its associated advantages or disadvantages. For instance, LGA packages are typically cheaper to manufacture than ball grid array (BGA) packages because there is no need to form solder balls or solder bumps. However, LGA packages are typically more difficult to assemble onto a PC board or a multi-chip module. An LGA connector is usually used to provide removable and remountable socketing capability for LGA packages connected to PC boards or to chip modules Advances in semiconductor technologies has led to shrinking dimensions within semiconductor integrated circuits and particularly, decreasing pitch for the contact points on a silicon die or a semiconductor package. The pitch, that is, the spacing between each electrical contact point (also referred to as a "lead") on a semiconductor device is decreasing dramatically in certain applications. For example, contact pads on a semiconductor wafer can have a pitch of 250 micron or less. At the 250-micron pitch level, it is prohibitively difficult and very expensive to use conventional techniques to make separable electrical connections to these semiconductor devices. The problem is becoming even more critical as the pitch of contact pads on a semiconductor device decreases below 50 microns and simultaneous connection to multiple contact pads in an array is required.

SUMMARY OF THE INVENTION

According to embodiments of the present disclosure, a connector for electrically connecting to conductive structures formed on an electronic component to be connected thereto includes a contact element layer including an array of contact elements extending from at least a first surface of the contact element layer, each contact element including a compliant spring element; and a ground plane layer formed attached to the first surface of the contact element layer, the ground plane layer being a conductive layer and including a set of openings corresponding to a first subset of contact elements in the array and one or more closed portions corresponding to a second subset of contact elements in the array. The first subset of contact elements positioned in the set of openings protrude through the openings outwardly from a first surface of the connector, and the second subset of contact elements in the array positioned under the closed portions are trapped by the closed portions of the ground plane layer and do not extend from the first surface of the connector.

According to other embodiments of the present disclosure, a connector for electrically connecting to conductive structures formed on an electronic component to be connected thereto includes a contact element layer including an array of contact elements extending from at least a first surface of the contact element layer, each contact element including a compliant spring element; and a ground plane layer formed attached to the first surface of the contact element layer. The ground plane layer is a conductive layer and includes a set of openings corresponding to a first subset of contact elements in the array and one or more closed portions corresponding to a second subset of contact elements in the array. The contact elements in the array are positioned in the set of openings and protrude through the openings outwardly from a first surface of the connector, and no contact elements are provided in positions under the closed portions.

According to other embodiments of the present disclosure, a connector module for electrically connecting to conductive structures formed on an electronic component to be connected thereto includes an electrical connector including an array of contact elements extending from at least a first surface of the connector, each contact element including a compliant spring element; and a ground plane overlay attached to the first surface of the connector. The ground plane overlay includes a conductive layer where the conductive layer includes a set of openings corresponding to a first subset of contact elements in the array and one or more closed portions corresponding to a second subset of contact elements in the array. The first subset of contact elements positioned in the set of openings protrude through the openings outwardly from the first surface of the connector, and the second subset of contact elements in the array positioned under the closed portions are trapped by the closed portions of the ground plane overlay and do not extend from the first surface of the connector.

According to other embodiments of the present disclosure, a connector for electrically connecting to conductive structures formed on an electronic component to be connected thereto includes a contact element layer including an array of contact elements extending from at least a first surface of the contact element layer where each contact element including a compliant spring element. The contact element layer further includes a patterned conductive layer forming an integrated ground plane. Contact elements in a first subset of contact elements are each electrically isolated from the integrated ground plane formed on the contact element layer and contact elements in a second subset of contact elements are each electrically shorted to and physically connected to the integrated ground plane formed on the contact element layer.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

FIG. 4, which includes FIG. 4(a), illustrates a ground plane overlay with closed ground portions to be applied to an electrical connector in an alternate embodiment of the present disclosure.

DETAILED DESCRIPTION OF THE INVENTION

In embodiments of the present disclosure, a separable and reconnectable electrical connector includes a contact array of signal pins and an integrated ground layer, also referred to as an integrated ground plane. In one embodiment, the electrical connector includes an array of contact elements and the integrated ground layer includes openings for contact elements forming signal pins and includes closed portions positioned over contact elements to be connected to the ground potential. In this manner, the array of contact elements is formed with a subset of the contact elements being trapped or compressed under the integrated ground layer. The contact elements trapped under the integrated ground layer are electrically connected to the ground potential to provide ground shielding without each being connected to a ground connection external to the connector. As thus configured, the electrical connector includes primarily a contact array of signal pins, without protruding contact elements for ground connection, which has the advantageous effect of reducing the compression force needed to mate the connector to an electronic component.

In embodiments of the present disclosure, the integrated ground layer can be provided in the electrical connector in several ways. In one embodiment, the integrated ground layer can be formed integrally within the electrical connector, such as by being glued, laminated, or soldered to a given layer forming the connector. In another embodiment, the integrated ground layer may be formed separately from the connector as a ground plane overlay and then attached to the connector, such as by using the alignment posts on the connector for positioning. Various embodiments of forming the electrical connector with the integrated ground plane will be described in more details below.

In an alternate embodiment of the present disclosure, a separable and reconnectable electrical connector includes a contact array of signal pins and ground pins formed in a contact element layer incorporating an integrated ground plane. In one embodiment, the connector includes a contact element layer in which an array of contact elements are formed. The contact element layer incorporates an integrated or circuitized ground plane where one or more contact elements are formed physically and electrically connected to the integrated ground plane to form ground pins. The circuitized ground plane includes openings where contact elements for signal pins are formed isolated from the integrated ground plane. In this manner, the connector is formed with ground pins electrically connected at the contact element layer to the ground potential which has the advantageous effect of providing shielding for the signal pins of the connector.

Figure 1:
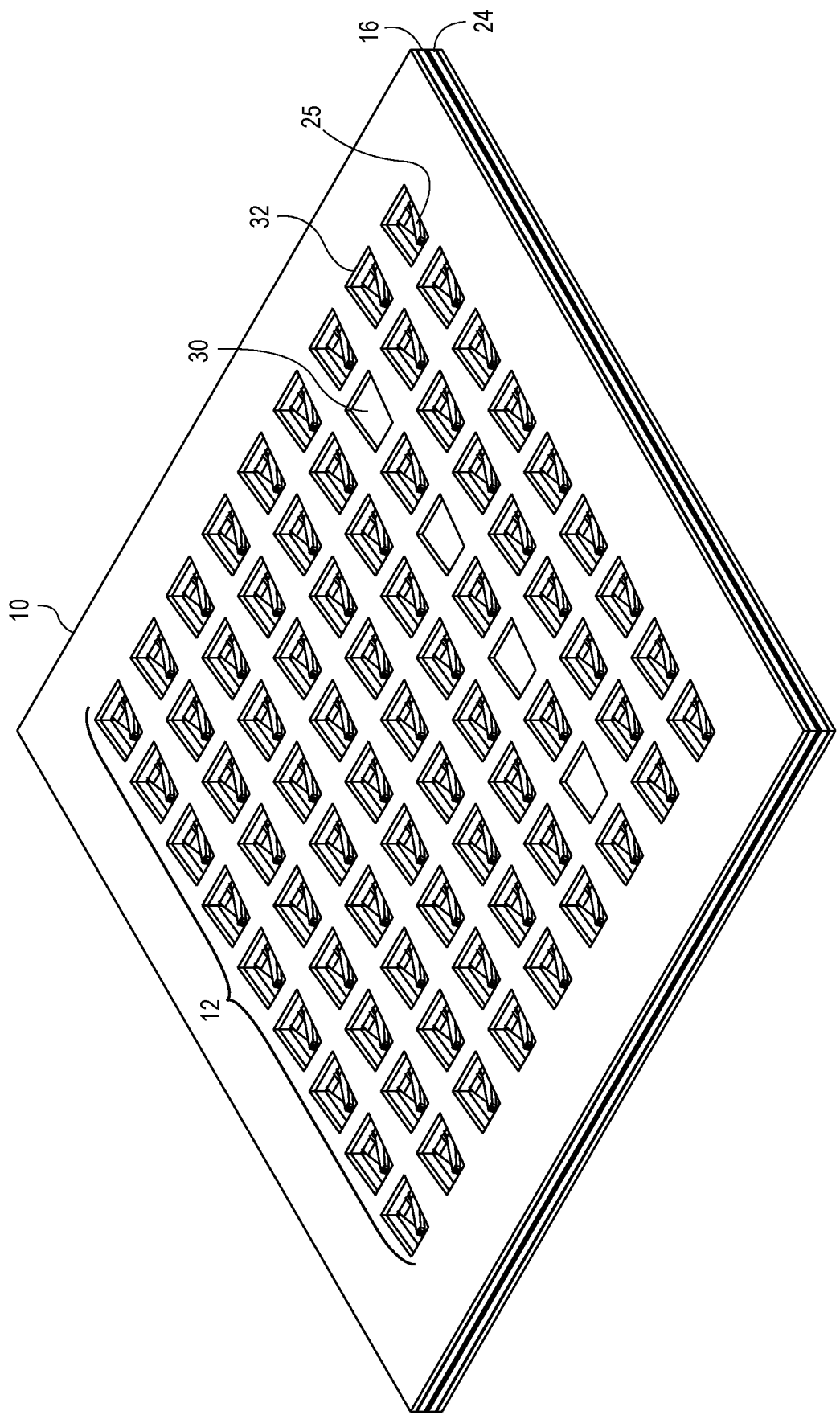
FIG. 1 is a perspective view of an electrical connector incorporating an integrated ground plane in a first embodiment of the present disclosure.

FIG. 1 is a perspective view of an electrical connector incorporating an integrated ground plane in a first embodiment of the present disclosure. In embodiments of the present disclosure, the connector is applied to use as an interposer and the terms "connector" and "interposer" may be used interchangeably in the present description. Referring to FIG. 1, a connector 10 includes a contact array 12 of contact elements 25, each contact element including a first elastic portion extending from a first surface (e.g. top surface) of the connector and a second elastic portion extending from a second, opposite surface (e.g. bottom surface) of the connector. The contact elements formed on the second surface are not shown in FIG. 1 but will be illustrated in the following figures. In the present embodiment, the contact array 12 is formed as a two-dimensional array of contact elements. The two-dimensional array configuration is illustrative only and not intended to be limiting. The contact elements 25 can be arranged in any configuration or design necessary for the components to be connected thereto. The connector 10 provides separable or remountable connection and is capable of retaining high quality electrical connection over repeated insertions.

In embodiments of the present disclosure, the contact elements 25 are formed as compliant spring contact elements. In the present embodiment, each contact element 25 is formed as metal flanges extending from a base portion. In other embodiments, other types of contact elements can be used depending on the components to which the interposer is to be connected. The contact elements used for the contact array in the connector is selected based on the type of contact structures of the component to which the interposer is to be coupled. In some examples, the connector is to be coupled to semiconductor components and the contact elements are configured to connect to conductive pads formed on the semiconductor components.

In embodiments of the present disclosure, the connector 10 can be used to make electrical connections from components such as a Printed Circuit Board (PCB) to another PCB, to a central processing unit or microprocessor, or to a network processor unit, or to a neural processing unit, or to a graphic processing unit, or other semiconductor device. Furthermore, the connector can be used to make electrical connections to electrical contact points formed on any electronic components. For example, the electrical contact points can be an array of metal pads, such as a land grid array, that are used as the electrical contact points for an integrated circuit package, a printed circuit board, or other electronic component. The connector of the present disclosure can be used to connect to a land grid array formed on a printed circuit board or formed on a semiconductor chip or other devices.

In embodiments of the present disclosure, the connector 10 includes an integrated ground layer or an integrated ground plane. For example, a first integrated ground plane 16 may be provided under the top coverlay isolation layer and a second integrated ground plane 24 may be provided under the bottom coverlay isolation layer. The integrated ground plane 16, 24 is formed of a conductive material, such as a conductive metal layer, and is preferably a rigid metal layer. In one embodiment, the integrated ground plane is formed using copper, or a copper alloy or a multilayer metal sheet, such as stainless steel coated with Copper-Nickel-Gold (Cu/Ni/Au) multilayer metal sheet. The integrated ground plane 16, 24 includes openings 32 to expose a first set of contact elements. That is, the contact elements 25 formed in the openings 32 are not electrically or physically connected to the integrated ground plane 16, 24. The contact elements 25 formed in the openings 32 protrude from the connector 10 to mate with the corresponding connection point on the electronic component to be connected. The integrated ground plane 16, 24 further includes closed ground portions 30 where no opening is provided for the contact element 25 formed in the array. As thus configured, the contact elements 25 formed under the closed ground portions 30 are trapped by the integrated ground plane. In particular, the trapped contact elements 25 under the closed ground portions 30 are in physical contact with the integrated ground plane and are electrically connected to the same electrical potential as the integrated ground plane.

It is instructive to note that contact elements under the closed ground portions 30 may be omitted from the contact array 12. That is, in some embodiment, no contact elements are provided in the positions in the contact array where the integrated ground plane 16, 24 has closed ground portions 30. The closed ground portions 30 provides the desired ground shielding for the surrounding signal pins. In normal manufacturing process, the contact array is formed by stamping an uniform array of contact elements. Accordingly, in some embodiments, contact elements that will be in the closed ground portions may be removed from the contact array. Thus, the contact array includes positions where the contact elements are absent. Alternately, the contact elements may be left in the array and the integrated ground plane traps or compresses those contact elements under the closed ground portions.

In embodiments of the present disclosure, various methods can be used to electrically connect the integrated ground plane to the ground potential. In one embodiment, one or more exposed contact elements 25 in the contact array 12 are designated as ground pin and are connected to the ground potential provided on the electronic component to be connected. The ground pin is electrically connected to the integrated ground plane to supply the ground potential to the integrated ground plane. In another embodiment, the integrated ground plane may be connected to one or more of the metal alignment posts formed on the electrical connector. The metal alignment posts (not shown in FIG. 1) are provided for mating alignment and are electrically connected to the ground potential of the electronic component connected thereto. Therefore, the integrated ground plane can be electrically connected to the ground potential by connecting the integrated ground plane to a metal alignment post. In other embodiments, the integrated ground plane may be connected to a fastener, a screw, or other retention hardware on the electrical connector (not shown in FIG. 1) which are typically connected to the ground potential of the electronic component connected thereto. Other methods for electrically connecting the integrated ground plane to the ground potential may be used, as is known by one skilled in the art.

As thus configured, the connector 10 includes exposed contact elements 25 forming signal pins and trapped or absent contact elements connected to the ground potential. The exposed contact elements 25 make physical connections to the electronic component connected thereto. Meanwhile, the trapped contact elements under the closed ground portions 30 do not make physical connection to the electronic component. Instead, the trapped contact elements are electrically connected to the ground potential of the integrated ground plane.

Using the integrated ground plane to trap and electrically connect certain contact elements in the electrical connector of the present invention realizes several advantages. First, the trapped contact elements, connected to the ground potential, provides ground shielding to the signal pins. Shielding is particularly important for high speed signal pins which need as much ground potential around them as possible to minimize interference and crosstalk.

Second, by trapping subset of contact elements used for ground connection, the number of exposed or protruding contact elements is reduced which has the effect of reducing the compression force required to mate the connector 10 to the desired electrical component. In particular, the compression force to mate the connector 10 to the desired electrical component is a function of the number of protruding contact elements. The fewer the protruding contact elements, the lower the compression force is needed to engage the connector.

Third, the manufacturing cost can be reduced since the trapped or absent contact elements are not susceptible to handling damage and yield can improve. Furthermore, when the contact elements under the closed ground portions are eliminated, the manufacturing cost is further reduced by reducing the contact element plating costs.

Fourth, the space allocated to the ground positions can be made smaller since a full size ground contact element is not needed. Thus, the overall connector size can be made more compact by the use of the trapped or absent contact elements for ground connection.

Lastly, the integrated ground plane provides an additional conductive layer for heat dissipation, thereby enhancing the thermal management of the electrical connector.

Figure 2:
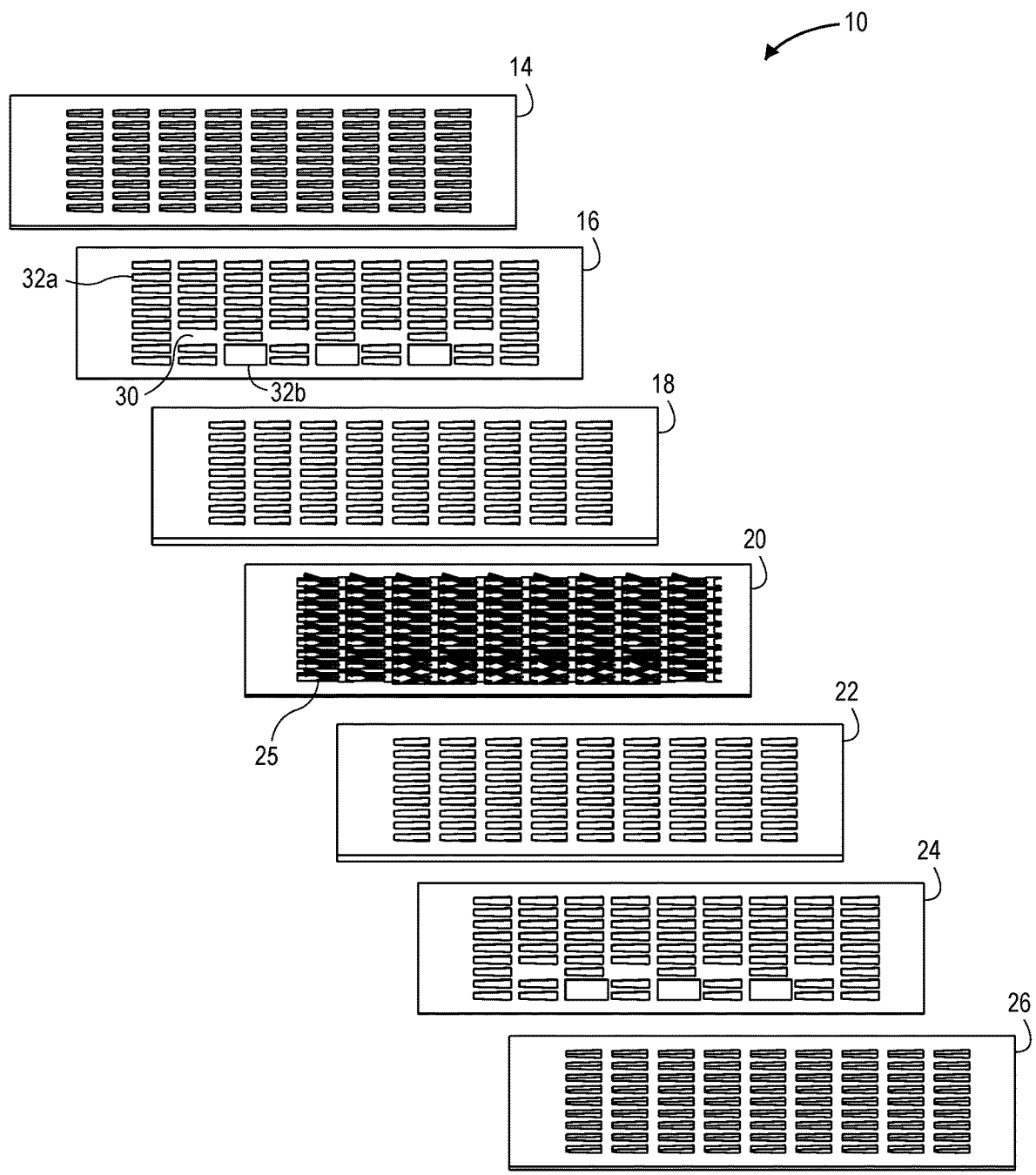
FIG. 2 is an exploded view of the electrical connector of FIG. 1 in embodiments of the present disclosure.

FIG. 2 is an exploded view of the electrical connector of FIG. 1 in embodiments of the present disclosure. Referring to FIG. 2, in some embodiments, the construction of the connector 10 of the present disclosure includes a top coverlay isolation layer 14, a top ground plane 16, a top adhesive layer 18, a contact element layer 20 with contact elements 25 formed thereon, a bottom adhesive layer 22, a bottom ground plane 24, and a bottom coverlay isolation layer 26. The top or bottom coverlay isolation layer 14, 26 is applied to encapsulate the connector 10, with openings to expose the spring element of the contact elements 25. In some embodiments, the coverlay isolation layer may be a thin, semi-rigid material. Top adhesive layer 18 is applied to attach the top ground plane 16 to the top surface of the contact element layer 20. The bottom adhesive layer 22 is applied to attach the bottom ground plane 24 to the bottom surface of the contact element layer 20. The top and bottom ground planes 16, 24 are made of conductive material, such as copper or a copper alloy. In some embodiments, the contact element layer 20 includes contact elements 25 formed on a substrate with openings for the contact elements.

It is instructive to note that the terms "top" and "bottom" are used in the present disclosure for ease of description and do not refer to specific direction or orientation or specific arrangement of layers. It is understood that electrical connector of the present disclosure has a first surface which can be referred to as the top surface and a second surface, opposite the first surface, which can be referred to as the bottom surface. The use of the terms "top" and "bottom" in the present description is illustratively only and not intended to be limiting.

In some embodiments of the present disclosure, planar contact elements are first formed in a thin conductive plane or a sheet of elastic material provided on a substrate. The substrate has openings corresponding to locations of the planar contact elements. The resultant planer compliant spring elements are then mechanically formed upward and downward and away from the surface of the conductive sheet of elastic material, forming the three-dimensional features of the contact elements. In some examples, each contact element includes a base portion and a compliant spring portion, also referred to as flanges or probes, that extends from the base portion. In the present embodiment, each contact element 25 includes a first spring portion that extends upward to form a compliant spring contact element on the top surface of the connector and a second spring portion that extends downward to form a compliant spring contact element on the bottom surface of the connector. The substrate with the sheet of the contact elements is referred herein as the contact element layer 20. In the present embodiment, the contact elements 25 are arranged to form a two-dimensional array of contact elements in the contact element layer 20. The contact element layer 20, with the contact elements 25, is attached to the top ground plane 16 using the adhesive layer 18, and is further attached to the bottom ground plane 24 using the adhesive layer 22. In other embodiments, the contact elements can be formed using any process currently known or to be developed.

In one embodiment, the top and bottom coverlay isolation layers 14, 26 are then attached to respective top and bottom ground planes 16, 24, such as through using additional adhesive layers. In the present description, the top and bottom coverlay isolation layers 14, 26 are optional and may be omitted in other embodiments. In an alternate embodiment, the top and bottom coverlay isolation layers 14, 26 are omitted and the top and bottom ground planes 16, 24 serves as the outer encapsulation layers of the connector 10.

It is instructive to note that the exploded view of FIG. 2 and other exploded or deconstructed views in the following description are provided to illustrate the various layers forming the electrical connector of the present disclosure. The exploded views are not intended to illustrate the actual order of elements or the actual construction of the connector. The exploded or deconstructed views in the present description are provided for illustrative purpose only.

In embodiments of the present disclosure, each of the top and bottom ground planes 16, 24 includes openings 32 formed thereon to expose the contact elements 25 formed on the contact element layer. The positions of the openings 32 are aligned with the positions of the contact elements 25. In some embodiments, the openings 32 include openings 32a for exposing a single contact element and openings 32b for exposing an adjacent pair of contact elements. The openings 32b are typically used for adjacent contact elements forming signal pins of a differential pair. Each of the top and bottom ground planes 16, 24 further includes closed ground portions 30. A closed ground portion 30 represents a location corresponding to a contact element 25 in the array but where the ground plane is closed or does not have an opening. In the present illustration, the top and bottom ground planes each has four closed ground portions 30.

As thus configured, the connector 10 includes a subset of contact elements that are exposed through the ground planes and protrude outward from the top or bottom surface of the connector. The connector 10 further includes a subset of contact elements that are trapped or compressed by the closed ground portions 30 of the ground planes 16, 24. In that case, the contact elements are compressed under the closed ground portions 30 and do not protrude outward from the connector 10 at all. The subset of trapped contact elements functions as ground pins to provide shielding to the other exposed contact elements functioning as signal pins.

As described above, in other embodiments, the contact element layer 20 may be formed with contact elements corresponding to the closed ground portions removed. That is, contact elements are absent from locations where the closed ground portions 30 are positioned. In the absence of a trapped contact element, the closed ground portions of the ground plane provides the shielding to the signal pins formed by the exposed contact elements.

Figure 3C:
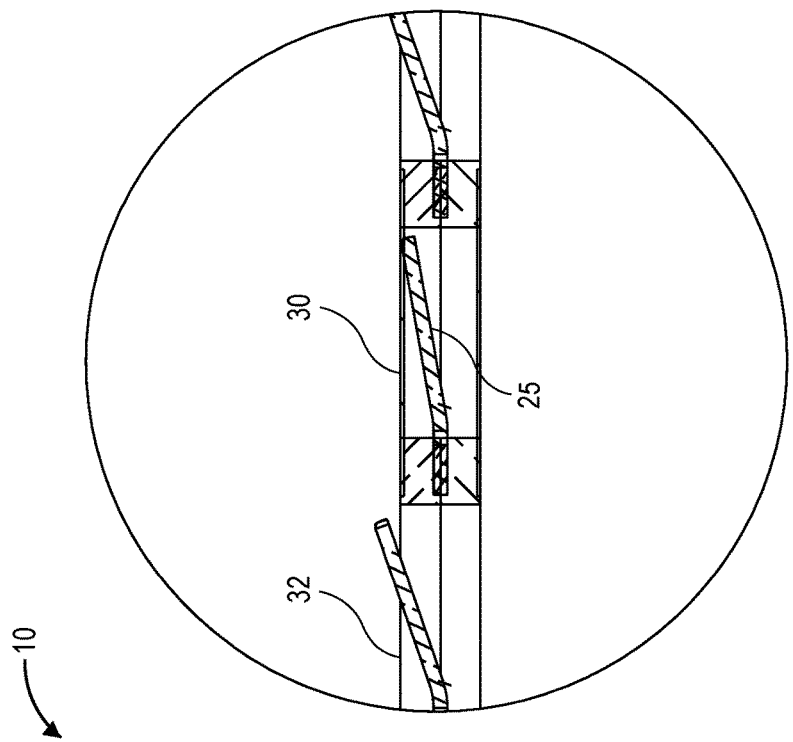
FIGS. 3(b) and 3(c) are cross-sectional views of the electrical connector of FIG. 3(a) in embodiments of the present disclosure.
Figure 3A:
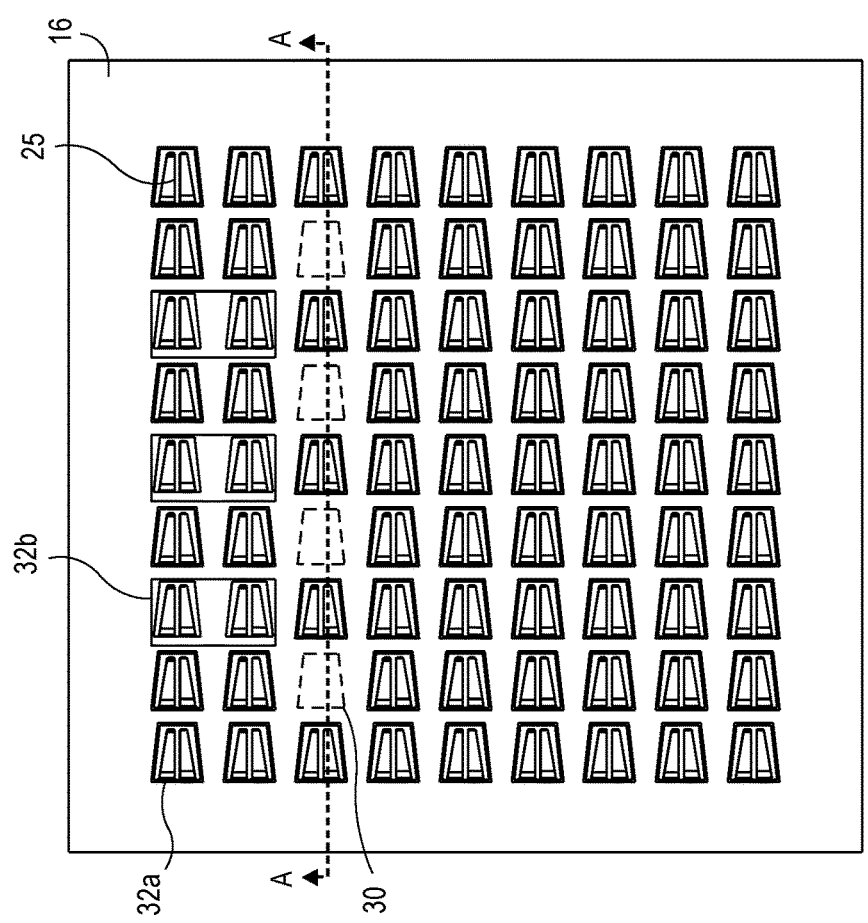
FIG. 3(a) is a top view of the electrical connector of FIG. 1 in embodiments of the present disclosure.
Figure 3B:
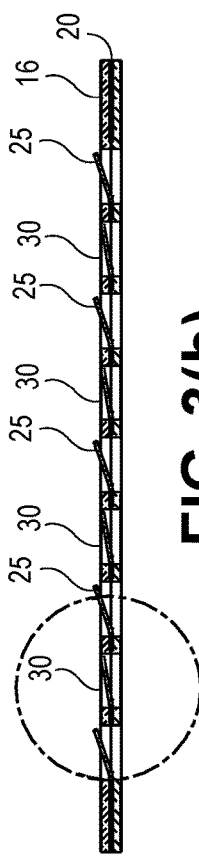

FIG. 3(a) is a top view of the electrical connector of FIG. 1 in embodiments of the present disclosure. FIGS. 3(b) and 3(c) are cross-sectional views of the electrical connector of FIG. 3(a) in embodiments of the present disclosure. In particular, FIG. 3(b) illustrates the cross-sectional view of the connector 10 along a line A-A' in FIG. 3(a) and FIG. 3(c) illustrates an enlarged cross-sectional view of a portion of the connector 10 in FIG. 3(b). Referring to FIG. 3(a), the connector 10 includes the top ground plane 16 with openings 32 exposing the contact elements 25 formed under the top ground plane in the contact element layer. The top coverlay isolation layer is omitted in the present illustration. Alternately, the connector 10 may be formed without the outer coverlay isolation layer. The top ground plane 16 includes openings 32a for exposing a single contact element and openings 32b for exposing a pair of adjacent contact elements. The top ground plane 16 includes closed ground portions 30 for trapping or compressing contact elements formed thereunder.

Referring to FIGS. 3(b) and 3(c), the cross-sectional views of the connector 10 along the line A-A' are shown. The contact elements 25 that are formed in the openings 32 protrude or extend outward from the connector 10 for engaging with an electronic component to be connected. Meanwhile, the contact elements that are formed under the closed ground portions 30 are trapped or compressed and do not extend outward or protrude from the connector 10. The connector 10 behaves as if there is no contact elements in the closed ground portions but the trapped contact elements are physically and electrically connected to the ground plane and thus biased to the ground potential, thereby providing shielding for the other contact elements forming the signal pins. As described above, the connector 10 can be formed without contact elements under the closed ground portions 30. The ground plane in those locations provides the necessary shielding.

In the above-described embodiment, the connector includes an integrated ground plane formed integrally with the connector. In other embodiments, the ground plane can be an overlay formed separately from the connector and coupled to the connector to function as the ground plane. FIG. 4, which includes FIG. 4(a), illustrates a ground plane overlay with closed ground portions to be applied to an electrical connector in an alternate embodiment of the present disclosure. Referring to FIG. 4, a ground plane overlay 50 includes an array of openings 52 corresponding to the positions of the contact elements of an electrical connector to which the overlay can be coupled. In the present illustration, the contact elements are assumed to be arranged in a two-dimensional array and the openings 52 are similarly arranged in a two-dimensional array. The ground plane overlay 50 further includes closed ground portions 55 at which connection to the ground potential is desired. The closed ground portions 55 function as a trap or a cap to compress contact elements positioned thereunder when the ground plane overlay 50 is coupled to a connector.

In some embodiments, the ground plane overlay 50 is a patterned metal plane, such as a patterned sheet metal layer. The metal layer may be patterned to include openings where desired for exposing contact elements and closed portions when grounding is desired. In other embodiments, the ground plane overlay 50 may be formed as a laminate including a conductive layer 58 sandwiched between two dielectric layers 57, 59. The conductive layer may be a patterned metal layer, such as sheet metal or copper. The dielectric layers may be an epoxy laminate material, such as an FR4 composite material, polyimide or other types of isolating materials. The laminate may be formed by patterning the dielectric layers to include an array of openings positioned at all of the contact element locations of the connector to be coupled while the conductive layer sandwiched between the dielectric layers is patterned to have openings for exposing the contact elements or closed portions at positions where grounding is desired.

Figure 5B:
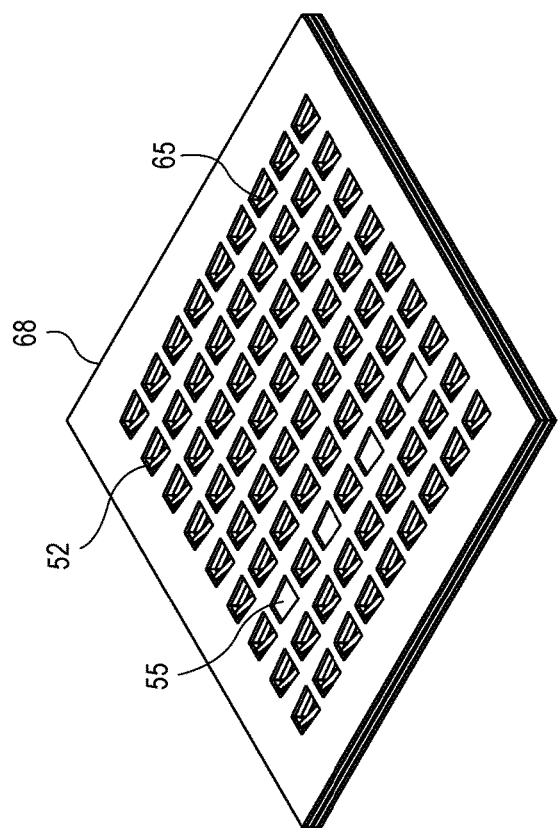
FIG. 5(b) is a perspective view of an electrical connector module illustrating the ground plane overlay coupled to the electrical connector of FIG. 5(a) in embodiments of the present disclosure.
Figure 5A:
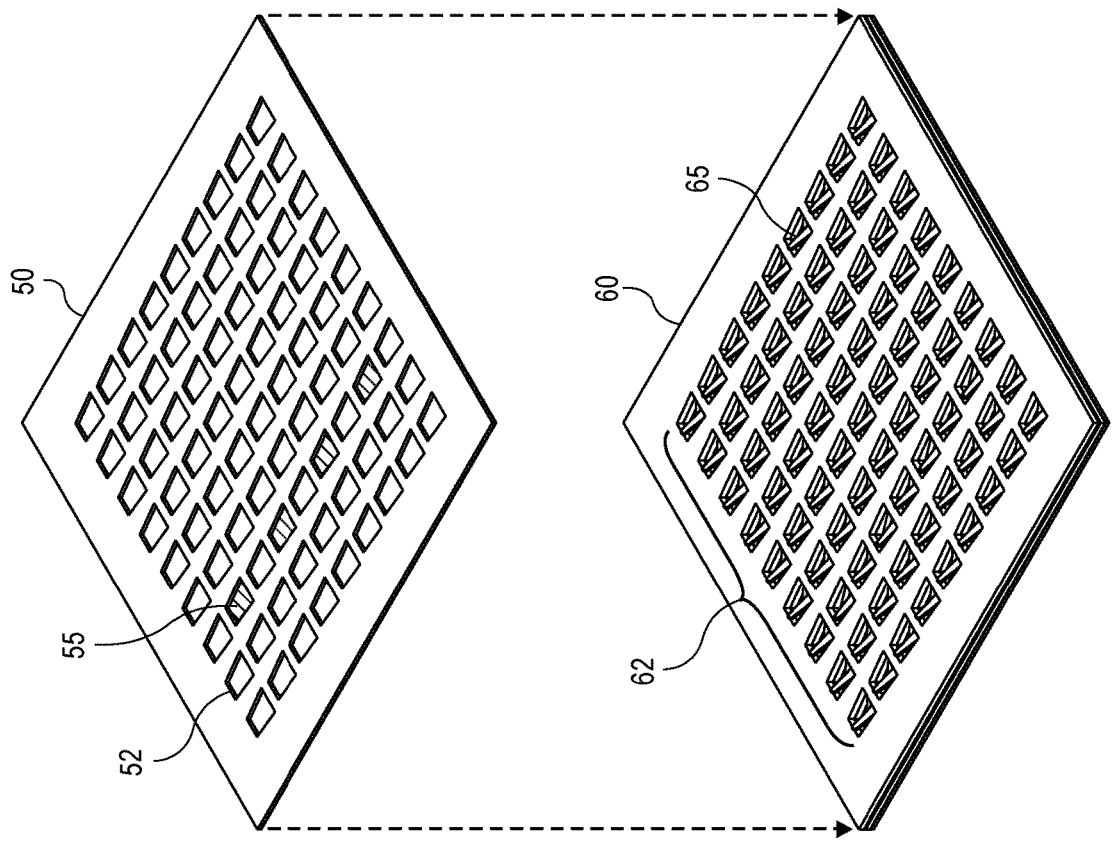
FIG. 5(a) is a perspective view of a ground plane overlay adapted to be coupled to an electrical connector in embodiments of the present disclosure.

As thus formed, the ground plane overlay 50 functions as a stencil and may be coupled to an electrical connector to trap or compress contact elements that should be connected to the ground potential. FIG. 5(a) is a perspective view of a ground plane overlay adapted to be coupled to an electrical connector in embodiments of the present disclosure. FIG. 5(b) is a perspective view of an electrical connector module illustrating the ground plane overlay coupled to the electrical connector of FIG. 5(a) in embodiments of the present disclosure. Referring to FIG. 5, an electrical connector 60 includes a contact array 62 of contact elements 65. In the present embodiment, the contact array 62 is a two-dimensional array of contact elements 65. The contact elements 65 can be formed as compliant spring contact elements in the manner described above. In particular, each contact element 65 includes a spring portion that protrudes upward and extends from the top surface of the connector 60. Each contact element 65 also includes a spring portion that protrudes downward (not shown) and extends from the bottom surface of the connector 60.

The ground plane overlay 50 includes openings 52 corresponding to the array 62 of contact elements 65 in the connector 60. In the present illustration, the ground plane overlay 50 includes openings 52 for exposing a single contact element in each opening. Alternately, the ground plane overlay 50 may include enlarged openings for exposing a pair of adjacent contact elements, such as to form a differential signal pin pair. The ground plane overlay 50 includes closed ground portions 55 where at least the portion of the conductive layer is not removed. When coupled to the connector 60, each closed ground portion 55 in ground plane overlay 50 traps or compresses a contact element under the closed ground portion and electrically connects the contact element to the ground potential. In alternate embodiment, the connector 60 may be formed with the contact elements corresponding to the closed ground portions 55 omitted or removed. In that case, the closed ground portions 55 provides the ground shielding at those locations.

In embodiments of the present disclosure, the ground plane overlay 50 is attached to electrical connector 60 to form a connector assembly where a subset of the contact elements in the connector 60 are trapped or compressed under the closed ground portions 55 of the ground plane overlay 50. In some embodiments, the ground plane overlay 50 is coupled to and aligned with the electrical connector 60 by using alignment posts on the electrical connector for positioning. In some embodiments, the ground plane overlay 50 can be attached to the electrical connector 60, such as by use of an adhesive or by use of soldering. It is instructive to note that FIG. 5(a) illustrates only a single ground plane overlay to be coupled to a first surface (e.g. the top surface) of the electrical connector. It is understood that a second ground plane overlay can be provided for coupling to the opposite surface (e.g. the bottom surface) of the electrical connector. The bottom ground plane overlay is not shown in FIG. 5(a) to simplify the discussion. In embodiments of the present disclosure, the electrical connector 60 is coupled to a top ground plane overlay for trapping a subset of contact elements on the top surface of the connector and a bottom ground plane overlay for trapping the corresponding subset of contact elements on the bottom surface of the connector, the trapped contact elements being connected to the ground potential.

Referring to FIG. 5(b), as thus configured, a separable and reconnectable electrical connector module 68 is formed which includes the electrical connector 60 having an array of contact elements 65 formed thereon and a ground plane overlay 50 attached to the first surface (e.g. the top surface) of the electrical connector. The ground plane overlay 50 includes openings 52 to expose contact elements 65 forming the signal pins and includes closed ground portions 55 positioned over contact elements to be connected to the ground potential. In this manner, the array of contact elements is formed with a subset of the contact elements being trapped or compressed under the ground plane overlay 50. The contact elements trapped under the ground plane overlay are electrically connected to the ground potential and function as ground pins without being connected to an external electronic component. As thus configured, the electrical connector module 68 includes primarily a contact array of signal pins, with trapped or absent contact elements connected to the ground potential.

As described above, the ground plane, whether integrated into the connector or provided as an overlay, may be connected to the ground potential through contacting with components of the connector, such as an alignment post or a retention hardware of the connector. In other examples, one or more of the exposed contact elements 65 may be designated as ground pins and connect to the ground potential of the electronic component to be connected. Other methods for providing the ground potential to the ground plane can also be used.

Figure 6:
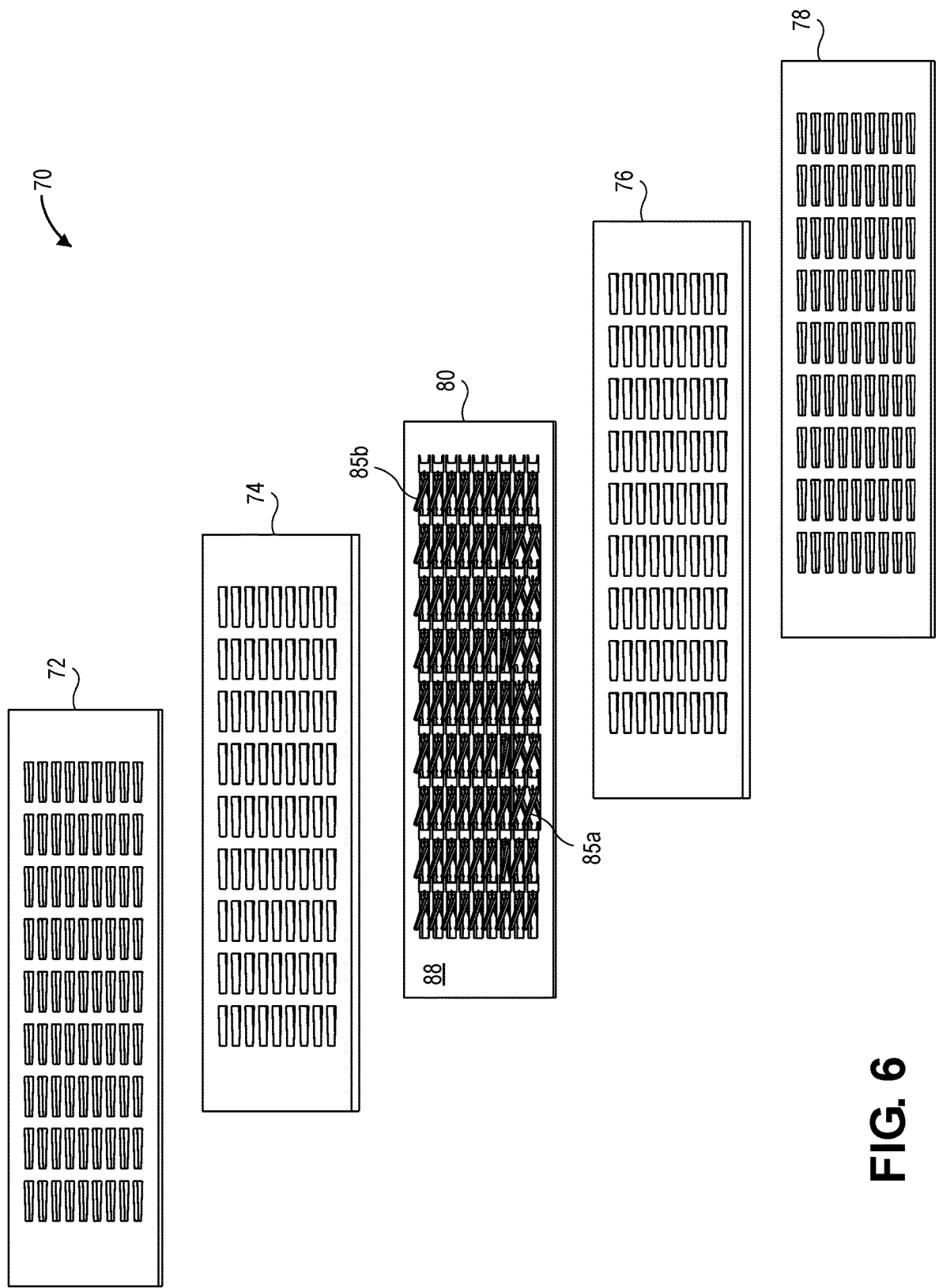
FIG. 6 is an exploded view of an electrical connector with an integrated ground plane contact element layer in embodiments of the present disclosure.

FIG. 6 is an exploded view of an electrical connector with an integrated ground plane contact element layer in embodiments of the present disclosure. Referring to FIG. 6, in some embodiments, a separable and reconnectable electrical connector 70 of the present disclosure includes a top coverlay isolation layer 72, a top adhesive layer 74, a contact element layer 80 with contact elements 85 formed thereon, a bottom adhesive layer 76, and a bottom coverlay isolation layer 78. The top or bottom coverlay isolation layer 72, 78 is applied to encapsulate the connector 70, with openings to expose the spring element of the contact elements 85. In some embodiments, the coverlay isolation layer may be a thin, semi-rigid material. Top adhesive layer 74 is applied to attach the top coverlay isolation layer 72 to top surface of the contact element layer 80. The bottom adhesive layer 76 is applied to attach the bottom coverlay isolation layer 78 to the bottom surface of the contact element layer 80.

In embodiments of the present disclosure, the contact element layer 80 incorporates an integrated ground plane 88. A subset of the contact elements, such as contact elements 85a, is isolated from the integrated ground plane 88 and the contact elements 85a can be used as signal pins of the connector 70. Another subset of contact elements 85b are physically and electrically connected to the integrated ground plane 88 and are therefore biased to the ground potential. The contact elements 85b functions as ground pins to provide shielding to the signal pins.

Figure 7:
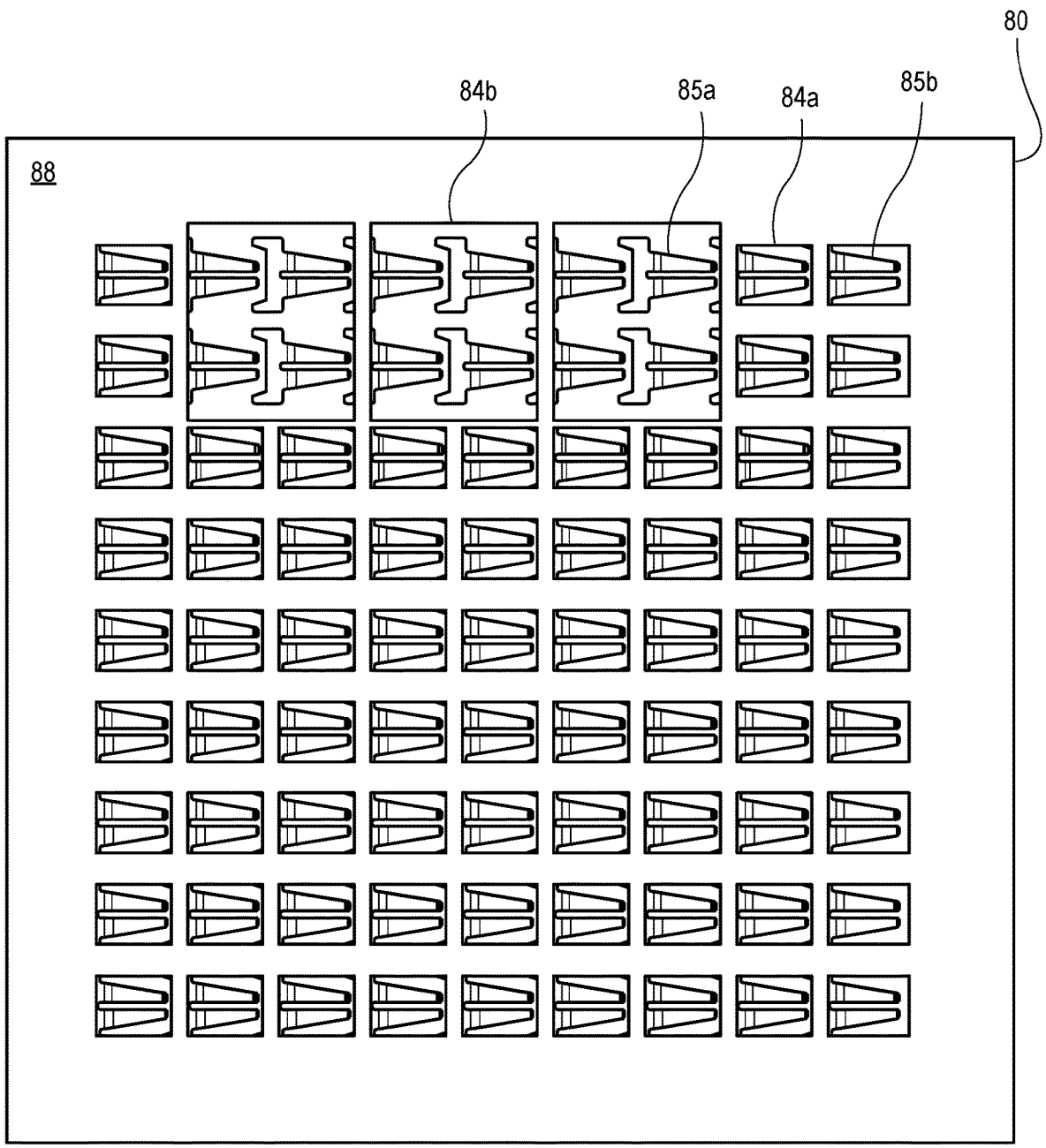
FIG. 7 is a top view of a contact element layer incorporating an integrated ground plane which can be used to form the electrical connector of FIG. 6 in embodiments of the present disclosure.

FIG. 7 is a top view of a contact element layer incorporating an integrated ground plane which can be used to form the electrical connector of FIG. 6 in embodiments of the present disclosure. Referring to FIG. 7, a contact element layer 80 for an electrical connector incorporates an integrated ground plane 88. In particular, the contact element layer 80 is formed on a substrate with openings 84 to allow compliant spring contact elements 85 to protrude from the top and bottom surfaces of the connector. For example, the contact element layer 80 may include openings 84a for accommodating a single contact element 85 and openings 84b for accommodating a pair of adjacent contact elements 85.

In the present embodiment, the contact element layer 80 includes a patterned conductive layer forming the integrated ground plane 88. For example, the integrated ground plane 88 may be formed from the same conductive plane or sheet from which the contact elements are formed. The integrated ground plane 88 is patterned to physically and electrically connect to contact elements 85b that are to be designated as ground pins. Accordingly, each contact element 85b is electrically shorted to the integrated ground plane 88 and will be biased to the ground potential of the integrated ground plane. Meanwhile, the integrated ground plane 88 is patterned to physically and electrically isolate contact elements 85a that are to be designated as signal pins. In this manner, the signal pins are isolated from the ground plane 88 but are shielded by the ground potential provided by the integrated ground plane 88 and the ground pins 85b connected to the ground plane 88. In some embodiment, the contact element layer 80 may be attached to top and bottom coverlay isolation layers, such as through using adhesive layers, to form the electrical connector which can be used to connect to electronic components, such as semiconductor integrated circuits or printed circuit boards.

As thus formed, the electrical connector includes a contact array of signal pins and ground pins formed in the contact element layer 80 which incorporates an integrated ground plane 88. In the present embodiment, the contact element layer 80 incorporates an integrated ground plane where the integrated ground plane is patterned so that one or more contact elements are formed physically and electrically connected to the integrated ground plane to form ground connections. The integrated ground plane is patterned to be isolated from contact elements forming signal pins. In this manner, the electrical connector includes ground pins that are electrically connected at the contact element layer to the ground potential which has the advantageous effect of providing shielding for the signal pins of the connector while maintaining a compact size for the connector.

It is instructive to note that normal process for forming the contact elements in the contact element layer is to isolate all the contact elements. The contact elements are not designated as ground pins or signal pins. The connection of the contact elements to the electronic component determines which contact elements are to be signal pins or ground pins. In embodiments of the present disclosure, the contact element layer 80 is patterned so that contact elements designated as ground pins are formed in the contact element layer by being connected together in the contact element layer and also connected to the integrated ground plane 88 to receive the ground potential. Contact elements designated as signal pins are isolated from the ground plane 88. In this manner, shielding of signal pins by the ground pins is implemented integrally within the electrical connector.

As described above, various method can be used to provide the ground potential to the ground pins or the integrated ground plane 88. A subset of contact elements 85b may be connected to the conductive pads on the electronic component to be connected to receive the ground potential. Alternately, the integrated ground plane 88 may be connected to the metal alignment post or to other retention hardware of the electrical connector to receive the ground potential.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A connector for electrically connecting to conductive structures formed on an electronic component to be connected thereto, comprising:
   a contact element layer comprising an array of contact elements extending from at least a first surface of the contact element layer, each contact element comprising a compliant spring element; and
   a ground plane layer formed attached to the first surface of the contact element layer, the ground plane layer being a conductive layer and comprising a plurality of openings corresponding to a first subset of contact elements in the array and one or more closed portions corresponding to a second subset of contact elements in the array,
   wherein the first subset of contact elements positioned in the plurality of openings protrude through the openings outwardly from a first surface of the connector, and the second subset of contact elements in the array positioned under the closed portions are trapped by the closed portions of the ground plane layer and do not extend from the first surface of the connector.

2. The connector of claim 1, wherein the array of contact elements comprises a two-dimensional array of contact elements and the plurality of openings in the ground plane layer are arranged in a two-dimensional array, each opening corresponding to a contact element in the first subset of contact elements and each closed portion corresponding to a contact element in the second subset of contact elements.

3. The connector of claim 1, wherein each contact element in the array of contact elements comprises a base portion and first and second compliant spring portions extending from the base portion, the first compliant spring portion extending outward from the first surface of the contact element layer to form a complaint spring element on the first surface of the connector, and the second compliant spring portion extending outward from a second surface, opposite the first surface, of the contact element layer to form a compliant spring element on a second surface of the connector.

4. The connector of claim 3, further comprising:
   a second ground plane layer formed attached to the second surface of the contact element layer, the second ground plane layer being a conductive layer and comprising a second plurality of openings corresponding to the first subset of contact elements in the array and one or more closed portions corresponding to the second subset of contact elements in the array,
   wherein the first compliant spring portions of the first subset of contact elements positioned in the plurality of openings of the ground plane layer protrude through the openings outwardly from the first surface of the connector, and the second compliant spring portions of the first subset of contact elements positioned in the second plurality of openings of the second ground plane layer protrude through the openings outwardly from the second surface of the connector; and
   wherein the first compliant spring portions of the second subset of contact elements in the array positioned under the closed portions of the ground plane layer are trapped by the closed portions of the ground plane layer and do not protrude from the first surface of the connector, and the second compliant spring portions of the second subset of contact elements in the array positioned under the closed portions of the second ground plane layer are trapped by the closed portions of the second ground plane layer and do not protrude from the second surface of the connector.

5. The connector of claim 1, wherein the ground plane layer comprises a conductive metal layer.

6. The connector of claim 1, wherein the second subset of contact elements are electrically connected to the same electrical potential as the ground plane layer.

7. The connector of claim 6, wherein the ground plane layer is electrically connected to a ground potential.

8. The connector of claim 7, wherein the ground plane layer is electrically connected to the ground potential by connecting to one of a metal alignment post or a retention hardware of the connector.

9. The connector of claim 7, wherein the ground plane layer is electrically connected to the ground potential by connecting to a first contact element in the first subset of contact elements, the first contact element to be connected to the ground potential on the electronic component to be connected.

10. The connector of claim 1, further comprising an adhesive layer to attach the ground plane layer to the contact element layer.

11. The connector of claim 10, further comprising a coverlay isolation layer attached to the ground plane layer to encapsulate the connector.

12. A connector module for electrically connecting to conductive structures formed on an electronic component to be connected thereto, comprising:
   an electrical connector comprising an array of contact elements extending from at least a first surface of the connector, each contact element comprising a compliant spring element; and
   a ground plane overlay attached to the first surface of the connector, the ground plane overlay comprising a conductive layer, the conductive layer comprising a plurality of openings corresponding to a first subset of contact elements in the array and one or more closed portions corresponding to a second subset of contact elements in the array,
   wherein the first subset of contact elements positioned in the plurality of openings protrude through the openings outwardly from the first surface of the connector, and the second subset of contact elements in the array positioned under the closed portions are trapped by the closed portions of the ground plane overlay and do not extend from the first surface of the connector.

13. The connector of claim 12, wherein the array of contact elements comprises a two-dimensional array of contact elements and the plurality of openings in the ground plane overlay are arranged in a two-dimensional array, each opening corresponding to a contact element in the first subset of contact elements and each closed portion corresponding to a contact element in the second subset of contact elements.

14. The connector of claim 12, wherein each contact element in the array of contact elements comprises a base portion and first and second compliant spring portions extending from the base portion, the first compliant spring portion extending outward from the first surface to form a complaint spring element on the first surface of the connector, and the second compliant spring portion extending outward from a second surface, opposite the first surface, of the connector to form a compliant spring element on a second surface of the connector.

15. The connector of claim 14, further comprising:
   a second ground plane overlay formed attached to the second surface of the connector, the second ground plane overlay being a conductive layer and comprising a second plurality of openings corresponding to the first subset of contact elements in the array and one or more closed portions corresponding to the second subset of contact elements in the array,
   wherein the first compliant spring portions of the first subset of contact elements positioned in the plurality of openings of the ground plane overlay protrude through the openings outwardly from the first surface of the connector, and the second compliant spring portions of the first subset of contact elements positioned in the second plurality of openings of the second ground plane overlay protrude through the openings outwardly from the second surface of the connector; and
   wherein the first compliant spring portions of the second subset of contact elements in the array positioned under the closed portions of the ground plane overlay are trapped by the closed portions of the ground plane overlay and do not protrude from the first surface of the connector, and the second compliant spring portions of the second subset of contact elements in the array positioned under the closed portions of the second ground plane overlay are trapped by the closed portions of the second ground plane overlay and do not protrude from the second surface of the connector.

16. The connector of claim 12, wherein the ground plane overlay comprises a patterned metal layer.

17. The connector of claim 12, wherein the ground plane overlay comprises a laminate including a conductive metal layer formed sandwiched between two dielectric layers.

18. The connector of claim 12, wherein the second subset of contact elements are electrically connected to the same electrical potential as the ground plane overlay.

19. The connector of claim 18, wherein the ground plane overlay is electrically connected to a ground potential.

20. The connector of claim 19, wherein the ground plane overlay is electrically connected to the ground potential by connecting to one of a metal alignment post or a retention hardware of the connector.

21. The connector of claim 19, wherein the ground plane overlay is electrically connected to the ground potential by connecting to a first contact element in the first subset of contact elements, the first contact element to be connected to the ground potential on the electronic component to be connected.

22. The connector of claim 12, wherein the ground plane overlay is attached to the connector by an adhesive or by soldering.

23. The connector of claim 12, wherein the second subset of contact elements are omitted from the array.

* * * * *